(12) United States Patent
Chen

(10) Patent No.: US 7,102,285 B2
(45) Date of Patent: Sep. 5, 2006

(54) PLASMA DISPLAY PANEL WITH PANEL UNIT THERMAL INTERFACE HAVING CARBON NANOTUBES

(75) Inventor: Ga-Lane Chen, Fremont, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 183 days.

(21) Appl. No.: 10/666,010

(22) Filed: Sep. 17, 2003

(65) Prior Publication Data

US 2004/0124772 A1 Jul. 1, 2004

(30) Foreign Application Priority Data

Dec. 25, 2002 (TW) ............................... 91137242 A

(51) Int. Cl.
*H01J 17/49* (2006.01)
(52) U.S. Cl. .......................................... 313/582; 313/46
(58) Field of Classification Search ................. 313/11, 313/39, 40, 44, 45, 46; 361/703, 704, 709
See application file for complete search history.

(56) References Cited

U.S. PATENT DOCUMENTS 5,990,618 A   11/1999   Morita et al.
6,410,841 B1   6/2002   Oh et al.
6,771,502 B1 *  8/2004   Getz et al. .................. 361/703
2002/0166654 A1 * 11/2002   Smalc .......................... 165/80.2
2003/0117770 A1 *  6/2003   Montgomery et al. ...... 361/687
2003/0183379 A1 * 10/2003   Krassowski et al. ........ 165/185

FOREIGN PATENT DOCUMENTS

WO    WO 98/40431    *   9/1998

* cited by examiner

*Primary Examiner*—Joseph Williams
*Assistant Examiner*—Matt Hodges
(74) *Attorney, Agent, or Firm*—Wei Te Chung

(57) ABSTRACT

The present invention provides a plasma display panel (10), which includes a panel unit (100) containing a large number of discharge cells (103), a heat sink unit (300) bonded along a back substrate (105) of the panel unit for dissipating heat generated by the panel unit, and a thermal interface (200) interposed between the panel unit and the heat sink unit for connecting the panel unit and the heat sink unit. The thermal interface is made of a thermal interface material including carbon nanotubes. The heat sink unit includes a substrate (302) and a plurality of fins (304), wherein the substrate is formed from an anisotropic material for transferring the heat from the panel unit to the fins of the heat sink unit. The plasma display panel thus has high heat conductive performance.

7 Claims, 2 Drawing Sheets

PLASMA DISPLAY PANEL WITH PANEL UNIT THERMAL INTERFACE HAVING CARBON NANOTUBES

BACKGROUND OF THE INVENTION

1. Field of the Invention

The present invention relates to a plasma display panel having high heat conductive performance.

2. The Related Art

Plasma display panels are widely used in applications such as gasoline dispensers. The plasma display panel comprises a panel unit containing a plurality of discharge cells. The panel unit emits light beams to display an image when a voltage is applied across electrodes of each of a selected group of discharge cells. The panel unit, which is the main part of the plasma display panel, is fabricated by bonding two glass base plates together in such a manner as to sandwich the discharge cells therebetween.

The discharge cells in the plasma display panel generate heat when they emit light for image formation, which causes the temperature of the panel unit to rise. As a brightness of the discharge cells increases, the amount of heat generated in the discharge cells also increases. And the discharge cells tend to exacerbate the breakage problem of the panel unit of the plasma display panel.

FIG. 2 is a schematic cross-sectional view showing a plasma display panel 150 disclosed in U.S. Pat. No. 5,990,618. The plasma display panel 150 comprises a panel unit 12 and a heat sink unit 2 bonded to the panel unit 12 with an adhesive layer 50. The heat sink unit 2 is made of aluminum or its alloy and the adhesive layer 50 is made of thermosetting silicone adhesive. The heat sink unit 2 comprises a plurality of fins 212 and a fin anchoring portion 211. The heat generated inside the panel unit 12 during the operation of the plasma display panel 150 is conducted to the heat sink unit 2 through the adhesive layer 50 and is dissipated into the outside air from the surfaces of the heat sink unit 2, especially from the surfaces of the fins 212.

However, the heat conductivity of the adhesive layer 50 is poor, so that heat generated by the panel unit 12 cannot be conducted to the heat sink unit 2 quickly. Further, the heat sink unit 2 is made of isotropic materials, resulting that the heat cannot be transferred directly to the fins 212 quickly and wholly because the heat is transferred in all directions in the fin anchoring portion 211 before being transferred to the fins 212. As a result, it is difficult to fully utilize the heat conduction performance of the fins 212, which has an adverse affect on the heat conductive performance of the heat sink unit 2.

SUMMARY OF THE INVENTION

An object of the present invention is to provide a plasma display panel having high heat conductive performance.

A plasma display panel in accordance with the present invention comprises a panel unit containing a large number of discharge cells, a heat sink unit bonded along a back substrate of the panel unit for dissipating heat generated by the panel unit, and a thermal interface interposed between the panel unit and the heat sink unit. The thermal interface is made of a thermal interface material having carbon nanotubes. The heat sink unit includes a substrate and a plurality of fins, wherein the substrate is formed from an anisotropic heat sinking material for quickly transferring the heat from the panel unit to the fins of the heat sink unit.

Much of the heat generated inside the panel unit is conducted from the back substrate of the panel unit to the heat sink unit through the thermal interface. The heat conducted to the heat sink unit is dissipated into the outside air from the surface of the heat sink unit, especially from the surfaces of the fins.

Other objects, advantages, and novel features of the present invention will become more apparent from the following detailed description when taken in conjunction with the accompanying drawings.

DESCRIPTION OF THE PREFERRED EMBODIMENT(S)

Figure 1:
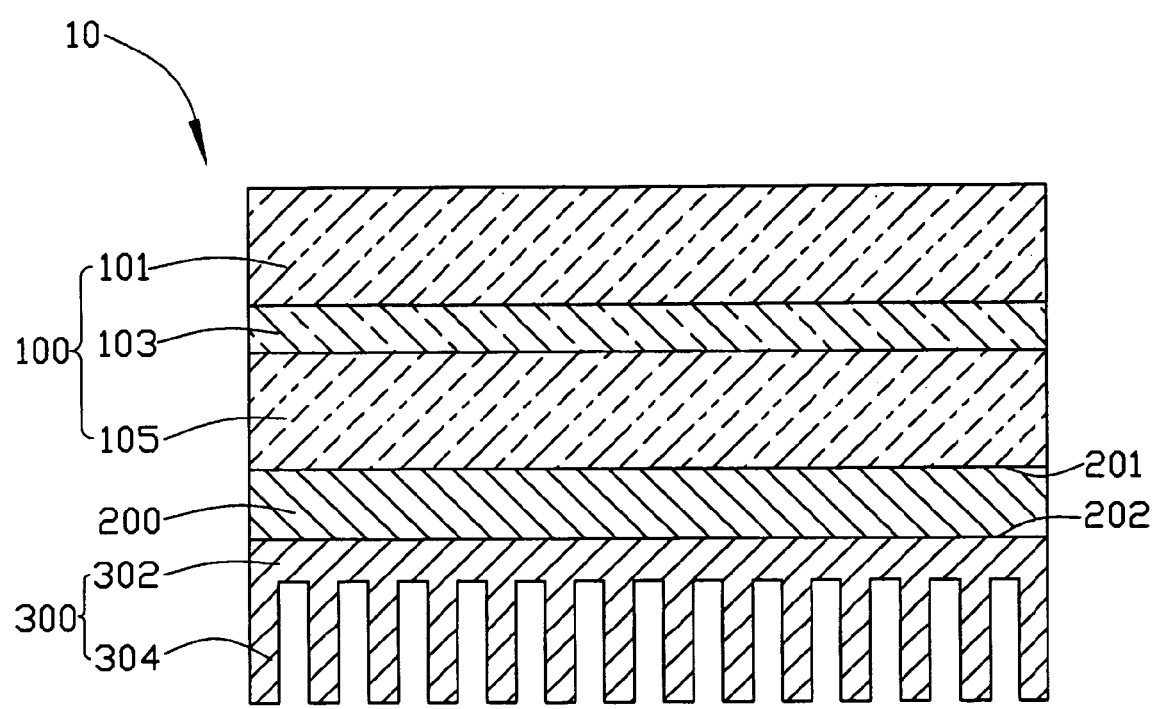
FIG. 1 shows a cross-sectional view of a plasma display panel of the present invention.
Figure 2:
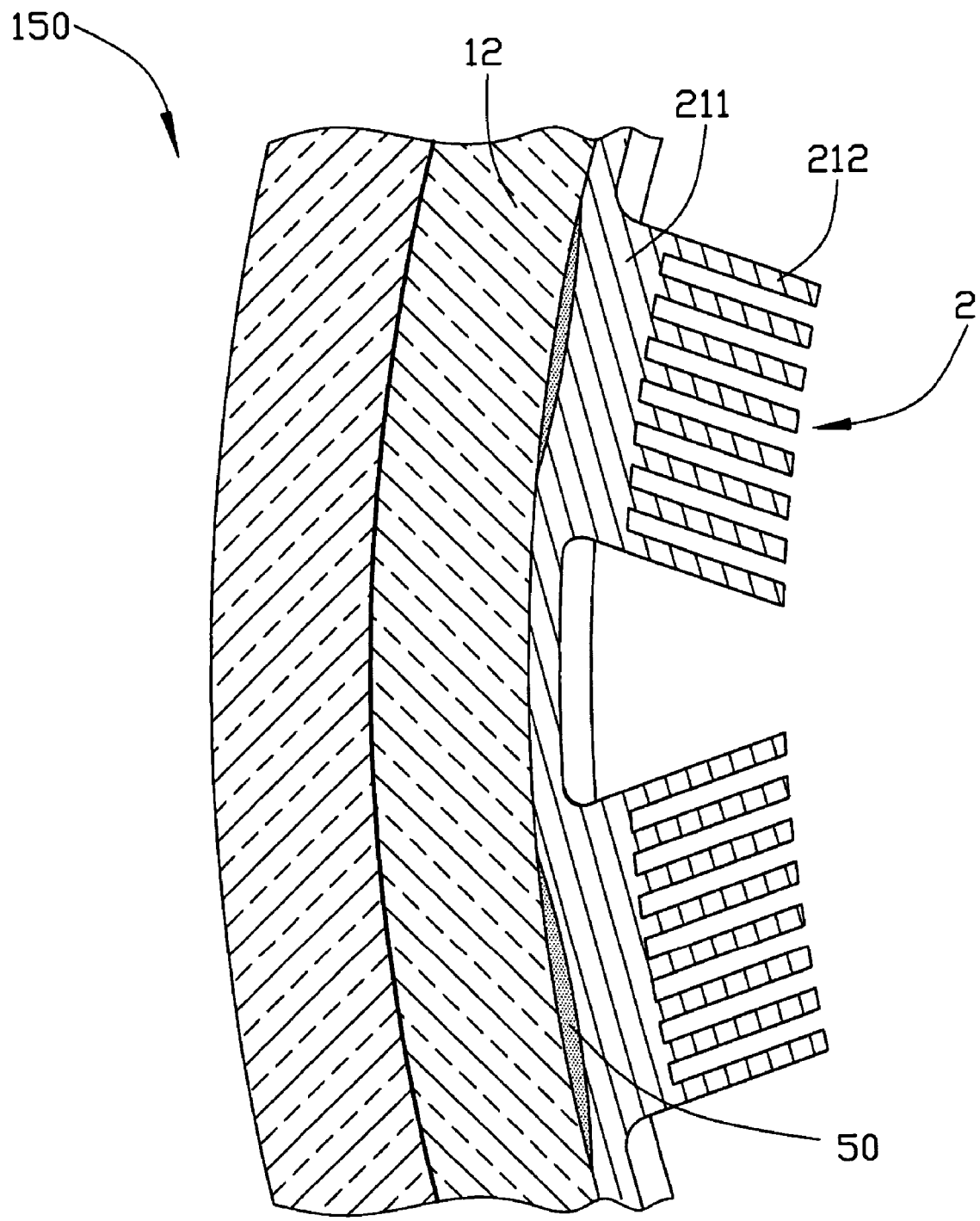
FIG. 2 shows a cross-sectional view of a prior art plasma display panel.

FIG. 1 shows a cross-sectional view of a plasma display panel 10 of a preferred embodiment in accordance with the present invention. The plasma display panel 10 includes a panel unit 100, a thermal interface 200 and a heat sink unit 300. The thermal interface 200 is interposed between the panel unit 100 and the heat sink unit 300.

The panel unit 100 comprises a front substrate 101, a back substrate 105 and a plurality of discharge cells 103 between the front substrate 101 and the back substrate 105. The discharge cells 103 are arranged horizontally and vertically in a matrix array manner. The panel unit 100 is about 5 millimeters in thickness. A plurality of flexible circuit boards (not shown) are provided which connect to electrodes from the discharge cells 103 to electrically drive the panel unit.

The thermal interface 200 is made of a thermal interface material having a plurality of carbon nanotubes (not shown), and the thermal interface 200 has a first surface 201 and a second surface 202 opposite to the first surface 201. The thermal interface 200 is interposed between the panel unit 100 and the heat sink unit 300. The first surface 201 of the thermal interface 200 is connected to the back substrate 105 of the panel unit 100, and the second surface 202 is connected to the substrate 302 of the heat sink unit 300.

The carbon nanotubes are highly-oriented, and form heat conduction channels in a direction perpendicular to the first and second surface 201, 202. Therefore, the thermal interface 200 provides excellent heat conduction capabilities. The carbon nanotubes have good thermal conductivity, but other synthetic resin sheets having good thermal conductivity, for example, a synthetic resin containing alumina, can be used instead of the carbon nanotubes. The thermal interface 200 has a thickness of about 0.1 millimeter.

The heat sink unit 300 which is connected to the second surface 202 includes a substrate 302 and a plurality of fins 304. The substrate 302 is made of an anisotropic heat sinking material. The material has a low heat resistance in a direction vertical to the substrate 302. Therefore, predominately single-axis heat conduction is realized in the vertical direction through the substrate 302. The fins 304 are made of an aluminum material and are formed to extend in a direction away from the panel unit 100. The fins 304 are spaced apart from each other by about 2 mm, each fin having a thickness of about 2 mm and an extrusion length of about 25 millimeters.

Heat generated inside the panel unit 100 during the operation of the plasma display panel 10 is dissipated from the outer surfaces of the panel unit 100. In particular, much of the heat generated inside the panel unit 100 is conducted from the back substrate 105 of the panel unit 100 to the heat sink unit 300 through the thermal interface 200. The heat conducted to the heat sink unit 300 is dissipated into the outside air from the surfaces of the heat sink unit 300, especially from the surfaces of the fins 304.

Compared with the prior art plasma display panel, the plasma display panel according to the present invention has the following advantages: Firstly, the thermal interface made of carbon nanotubes has a high conductivity and the carbon nanotubes form heat conduction channels in the vertical direction of the thermal interface, so that the heat can be transferred through the thermal interface quickly. Second, the substrate of the heat sink unit is formed from an anisotropic material, which has a single-axis heat conduction, so that the heat can be transferred directly through the substrate to the fins of the heat sink unit. Thus, the plasma display panel is capable of suppressing a temperature rise in the panel unit.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

The invention claimed is:

1. A plasma display panel comprising:
a panel unit containing a large number of discharge cells;
a heat sink unit which includes a substrate and a plurality of fins extending from the substrate, the substrate of the heat sink unit being bonded along a back substrate of the panel unit for dissipating heat generated by the panel unit, the fins being made of aluminum material; and
a thermal interface interposed between the back substrate of the panel unit and the substrate of the heat sink unit for connecting the panel unit and the heat sink unit;
wherein the substrate of the heat sink unit is formed of an anisotropic material for transferring the heat from the panel unit directly through the heat sink unit substrate to the fins of the heat sink unit, and the thermal interface comprises carbon nanotubes, which form heat conduction channels perpendicular to surfaces of the thermal interface which contact the back substrate of the panel unit and the substrate of the heat sink unit.

2. The plasma display panel as claimed in claim 1, wherein a heat conduction axis of the heat sink substrate material is parallel to a direction of extension of the fins.

3. The plasma display panel as claimed in claim 1, wherein the thermal interface is about 0.1 mm thick.

4. The plasma display panel as claimed in claim 1, wherein said fins extend perpendicular to said surfaces of the thermal interface.

5. A method of making a plasma display panel, comprising steps of:
providing a panel unit containing a large number of discharge cells;
providing a heat sink unit which includes a substrate and a plurality of fins extending from the substrate, the substrate of the heat sink unit being bonded along a back substrate of the panel unit for dissipating heat generated by the panel unit, the fins being made of aluminum material; and
filling a space between the back substrate of the panel unit and the substrate of the heat sink unit with a thermal interface for thermal connection therebetween; wherein
at least one of the substrate of the heat sink unit and the thermal interface is provided with an anisotropic character for efficiently transferring the heat from the panel unit through the heat sink unit substrate to the fins of the heat sink unit in a specific single direction, and the thermal interface comprises carbon nanotubes, which form heat conduction channels perpendicular to surfaces of the thermal interface which contact the back substrate of the panel unit and the substrate of the heat sink unit.

6. The method as claimed in claim 5, wherein the fins extend perpendicular to the substrate of the heat sink unit.

7. The method as claimed in claim 6, wherein said specific single direction is perpendicular to the substrate of the heat sink.

* * * * *